(12) United States Patent
Moore

(10) Patent No.: US 6,799,603 B1
(45) Date of Patent: Oct. 5, 2004

(54) GAS FLOW CONTROLLER SYSTEM

(75) Inventor: Gary M. Moore, Los Gatos, CA (US)

(73) Assignee: Moore Epitaxial, Inc., Tracy, CA (US)

( * ) Notice: Subject to any disclaimer, the term of this patent is extended or adjusted under 35 U.S.C. 154(b) by 0 days.

(21) Appl. No.: 09/399,611

(22) Filed: Sep. 20, 1999

(51) Int. Cl.[7] ............................. C23C 16/00; F17D 3/00
(52) U.S. Cl. .................... 137/597; 137/486; 137/487.5; 118/715
(58) Field of Search ................................. 137/597, 486, 137/487.5; 118/715; 134/102.3, 102.2, 95.2

(56) References Cited

U.S. PATENT DOCUMENTS

| | | | |
|---|---|---|---|
| 4,658,855 A | * 4/1987 | Doyle | 137/468 |
| 4,747,367 A | 5/1988 | Posa | 118/715 |
| 5,053,247 A | 10/1991 | Moore | 427/55 |
| 5,142,483 A | 8/1992 | Basham et al. | 364/510 |
| 5,207,835 A | 5/1993 | Moore | 118/725 |
| 5,417,236 A | 5/1995 | Moore et al. | 137/15 |
| 5,417,346 A | 5/1995 | Ferri, Jr. et al. | 222/61 |
| 5,421,288 A | * 6/1995 | Ohta | 118/724 |
| 5,444,217 A | 8/1995 | Moore et al. | 219/405 |
| 5,492,736 A | * 2/1996 | Laxman et al. | 427/579 |
| 5,580,388 A | 12/1996 | Moore | 118/728 |
| 5,601,107 A | 2/1997 | Moore et al. | 137/15 |
| 5,635,242 A | 6/1997 | Agnello et al. | 427/248.1 |
| 5,683,518 A | 11/1997 | Moore et al. | 118/730 |
| 5,710,407 A | 1/1998 | Moore et al. | 219/405 |
| 5,728,222 A | * 3/1998 | Barbee et al. | 118/715 |
| 5,746,834 A | 5/1998 | Hanley | 118/715 |
| 5,802,099 A | 9/1998 | Curran et al. | 374/131 |
| 5,820,686 A | 10/1998 | Moore | 118/730 |
| 5,843,234 A | 12/1998 | Finn et al. | 118/715 |
| 5,872,632 A | 2/1999 | Moore | 356/381 |
| 6,051,286 A | 4/2000 | Zhao et al. | 427/576 |
| 6,083,321 A | * 7/2000 | Lei et al. | 118/719 |
| 6,126,753 A | * 10/2000 | Shinriki et al. | 118/715 |
| 6,328,221 B1 | 12/2001 | Moore et al. | 239/1 |

* cited by examiner

*Primary Examiner*—Richard Bueker
(74) *Attorney, Agent, or Firm*—Gunnison, McKay & Hodgson, L.L.P.; Serge J. Hodgson

(57) ABSTRACT

A gas flow controller system includes a support structure and a gas manifold and gas manifold inlet valve located at the support structure. The gas manifold is coupled to one or more injector ports of a reactor by a process gas supply line. The reactor is supported by the support structure. Since the gas manifold and the gas manifold inlet valve are also located at the support structure, the length of the gas manifold and the process gas supply line is relatively short. Due to this relatively short length, process gas within the gas manifold and the process gas supply line is removed in a relatively short time after the flow of process gas to the gas manifold is shut off.

6 Claims, 9 Drawing Sheets

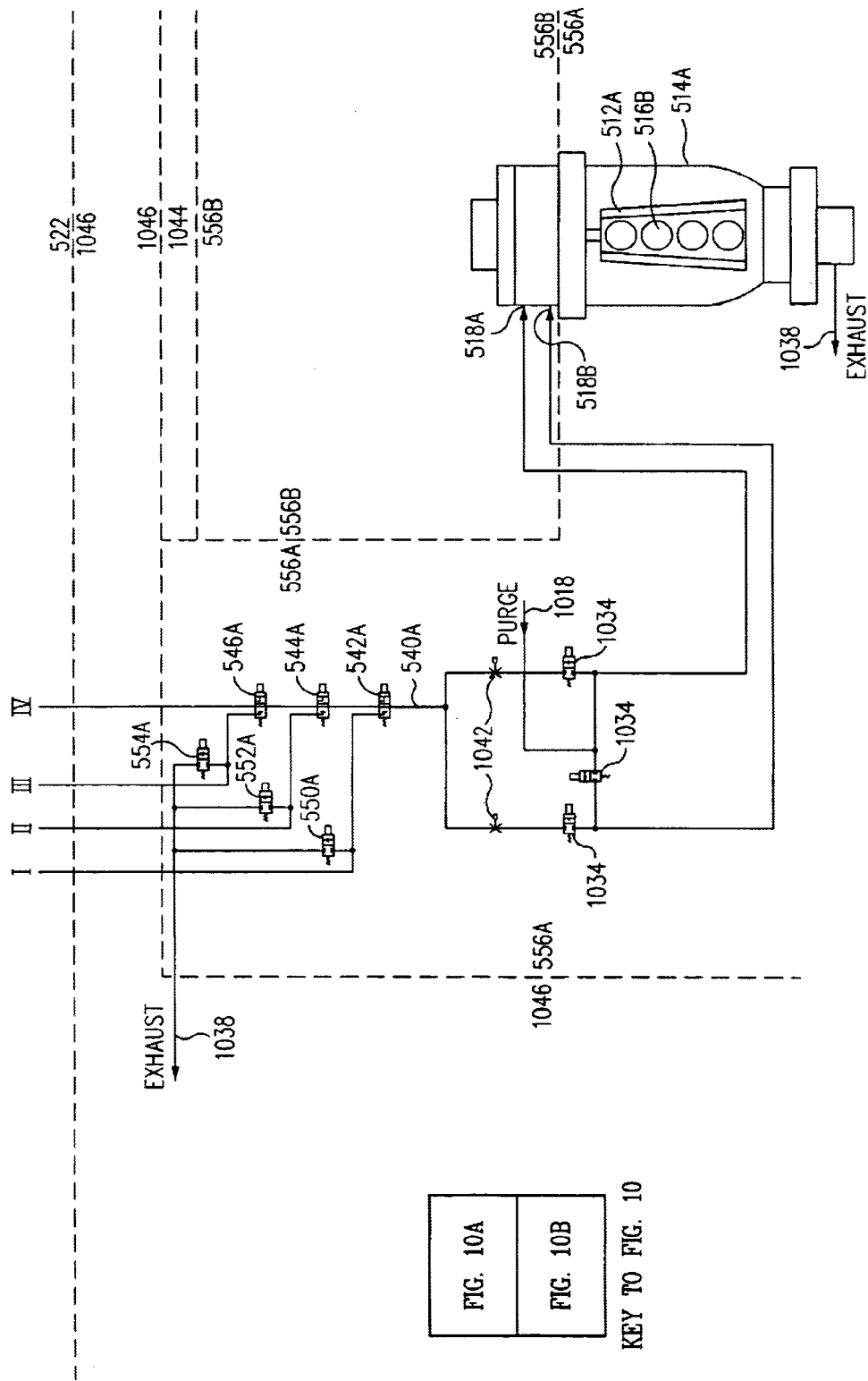

US 6,799,603 B1

GAS FLOW CONTROLLER SYSTEM

FIELD OF THE INVENTION

This invention relates generally to semiconductor process equipment, and more particularly, to a method and systems for controlling gas flow to a semiconductor processing reactor.

BACKGROUND OF THE INVENTION

Semiconductor processing typically involves the formation of one or more layers on a semiconductor substrate. For example, silicon epitaxy, sometimes called epi, is a process in which one or more layers of single-crystal (monocrystalline) silicon are deposited on a monocrystalline silicon wafer.

FIG. 1 is a schematic representation of a semiconductor processing system 10 in accordance with the prior art. As shown in FIG. 1, system 10 included a susceptor 12 enclosed within a barrel reactor 14. Susceptor 12 supported a plurality of substrates 16, typically monocrystalline silicon wafers.

During processing, substrates 16 were heated with an external radiation source such as tungsten halogen lamps, resistive heating elements and/or RF heaters (not shown).

A process gas was introduced into reactor 14 through one or more injector ports 18. The process gas typically included trichlorosilane although other process gases besides trichlorosilane sometimes were used depending upon the particular type of layer that was deposited. The process gas reacted with heated substrates 16 resulting in the deposition of layers on substrates 16 as those skilled in the art understand. The spent process gas was exhausted through a vacuum pump 20 to exhaust 23. Alternatively, the spent process gas was directly exhausted to exhaust 23 and vacuum pump 20 was not used.

Of importance, to insure the consistency and quality of the deposited layers on substrates 16, the composition and mass flow rate of the process gas delivered to reactor 14 was carefully controlled. For this reason, system 10 included a gas flow control system 21 coupled to injector ports 18 by a process gas line 24. Gas flow control system 21 was generally located in a gas cabinet 22 located at a distance from reactor 14.

Located within a gas bottle cabinet 49 were three process gas sources 26, 28, 30 and a carrier gas source 50. Illustratively, process gas sources 26, 28, 30 and carrier gas source 50 included compressed gas cylinders containing process gases A, B, C, and carrier gas CG, respectively.

Process gas sources 26, 28, 30 were coupled to a gas manifold 38 of system 21 through mass flow controllers (MFCs) 32, 34, 36, respectively, of system 21. Gas manifold 38 had a plurality of input ports 38A, 38B, 38C, a first output port 38Y and a second output port 38Z. MFCs 32, 34, 36 controlled and regulated the mass flow rates of flows of process gases A, B, C from process gas sources 26, 28, 30, respectively, to input ports 38A, 38B and 38C, respectively, of gas manifold 38. Output port 38Y of gas manifold 38 was coupled to process gas line 24 by valve 40 of system 21. Output port 38Z of gas manifold 38 was coupled to an inlet of vacuum pump 20 (generally referred to as exhaust 23) by valve 42 of system 21. An outlet of vacuum pump 20 was coupled to exhaust 23. Alternatively, vacuum pump 20 was not used and output port 38Z of gas manifold 38 was directly coupled to exhaust 23 by valve 42.

Carrier gas source 50 was coupled to process gas line 24 through a mass flower controller (MFC) 52 of system 21.

MFC 52 controlled and regulated the mass flow rate of a flow of carrier gas CG from carrier gas source 50 to process gas line 24.

To illustrate the operation of gas flow control system 21, assume that a heavily doped P type silicon layer was to be deposited after which a lightly doped P type silicon layer was to be deposited on substrates 16. In this example, process gas C was a P type dopant gas. Further, process gas B was a source of silicon, e.g., was trichlorosilane.

Initially, to form the heavily doped P type silicon layer, valve 42 was open and valve 40 was closed. Process gases B, C from process gas sources 28, 30 flowed through MFCs 34, 36, respectively, to gas manifold 38. In gas manifold 38, process gases B, C mixed (the mixture of process gases B, C is hereinafter referred to as high dopant concentration process gas). The high dopant concentration process gas flowed from gas manifold 38 through valve 42 to exhaust 23.

As those skilled in the art understand, gas must flow through a mass flow controller (MFC) for a certain period of time after activation of the MFC to allow the mass flow rate of the flow of gas through the MFC to stabilize and to allow the MFC to accurately control the mass flow rate of the flow of gas. Thus, the flow of the high dopant concentration process gas to exhaust 23 continued until the mass flow rates of the flows through MFCs 34, 36 stabilized. Valve 40 was opened and valve 42 was closed thereby providing the high dopant concentration process gas through process gas line 24 and injector ports 18 into reactor 14. The high dopant concentration process gas reacted with heated substrates 16 and formed the heavily doped P type silicon layer on each of substrates 16.

After a predefined time period, valve 40 was closed to stop the flow of the high dopant concentration process gas into reactor 14 and to stop the deposition of the heavily doped P type silicon layer on substrates 16. FIG. 2 is a graph of the concentration of the high dopant concentration process gas in reactor 14 verses time after shutting-off the flow of the high dopant concentration process gas to reactor 14 by closing valve 40.

Referring to FIGS. 1 and 2 together, time T=0 is at the end of the predefined period when valve 40 was closed. After valve 40 was closed, the concentration of the high dopant concentration process gas gradually decreased in reactor 14 as the high dopant concentration process gas was displaced by carrier gas CG supplied from carrier gas source 50. In particular, a length of time T=T1, e.g., thirty seconds to two minutes or more, after valve 40 was closed passed before the high dopant concentration process gas was fully removed from reactor 14. Undesirably, the high dopant concentration process gas continued to react and formed a transition layer on the newly formed heavily doped P type silicon layer until the high dopant concentration process gas was fully removed from reactor 14.

After the high dopant concentration process gas was fully removed from reactor 14, the lightly doped P type silicon layer was deposited. Valve 42 was opened and process gas A, hereinafter referred to as low dopant concentration process gas, flowed through MFC 32 through valve 42 to exhaust 23 until the mass flow rate of the flow through MFC 32 stabilized. Valve 40 was opened and valve 42 was closed thereby providing the low dopant concentration process gas into reactor 14. The low dopant concentration process gas reacted with heated substrates 16 and formed the lightly doped P type silicon layer on substrates 16.

FIG. 3 is a graph of dopant concentration versus depth in a substrate 16 in accordance with the prior art process described above. Referring to FIG. 3, the top of the heavily doped P type silicon layer described above (hereinafter referred to as HD layer L1) was located at a distance D1 from a surface of substrate 16.

Referring to FIGS. 1 and 3 together, after HD layer L1 was formed with a desired thickness D1, valve 40 was closed to stop the flow of the high dopant concentration process gas to reactor 14. However, after closing of valve 40, transition layer TL was formed on HD layer L1.

Since the concentration of the high dopant concentration process gas diminished in reactor 14 after valve 40 was closed, the dopant concentration of transition layer TL gradually changed from heavily doped HD at the bottom of transition layer TL to lightly doped LD at the top of transition layer TL. The lightly doped P type silicon layer (hereinafter LD layer L2) was formed on transition layer TL.

As the art moves towards smaller high speed devices, it is important that the transition between layers be abrupt. In particular, referring to FIG. 3, it is important to reduce or eliminate transition layer TL between the top of HD layer L1 and the bottom of LD layer L2. Unfortunately, it is not possible to instantaneously purge the reaction chamber. Thus, the current generation of semiconductor processing reactors do not appear suitable for manufacturing the substrates used in making the smaller high speed devices.

In addition to having abrupt transitions between layers, it is also important to accurately control the dopant concentration within a layer in any particular batch and also from batch to batch. To illustrate, referring to FIG. 3, if the P type dopant concentration of the high dopant concentration process gas which formed HD layer L1 was to high (low), the P type dopant concentration of HD layer L1 exceeded (fell short of) the desired concentration HD of HD layer L1 as indicated by the line 304 (306).

FIG. 4 is a schematic representation of process gas source 30 of FIG. 1 illustrating the dilution of a dopant gas DG with a carrier gas CG in accordance with the prior art. As shown in FIG. 4, process gas source 30 included a mixer 50. Coupled to mixer 50 was a check valve 52 through which carrier gas CG, e.g. hydrogen, flowed. Also coupled to mixer 50 was a mass flow controller (MFC) 54 through which dopant gas DG flowed. In mixer 50, carrier gas CG and dopant gas DG mixed. The mixture of carrier gas CG and dopant gas DG was supplied as process gas C to a mass flow controller (MFC) 56 and to MFC 36. MFC 36 controlled and regulated the mass flow rate of the flow of process gas C to reactor 14 as discussed above. MFC 56 controlled and regulated the mass flow rate of the flow of process gas C to exhaust 23.

Observation of the dopant concentration in a layer formed using this apparatus reveals variations in the dopant concentration within the layer from batch to batch. While for conventional devices the variations are not significant, the variations are not acceptable for emerging process technologies that require a substantially constant doping concentration within a layer. Consequently, in addition to the problems with formation of transition layers, the present configurations do not produce the desired uniform doping level that is needed. Therefore, to achieve high volume quality production of thin layers, new apparatus and configurations will be required.

SUMMARY OF THE INVENTION

In accordance with the present invention, a gas flow controller system is located directly adjacent to a point of use that typically is a semiconductor processing reactor. This configuration eliminates the long prior art gas supply line that was between the gas manifold and the point of use. Consequently, this configuration eliminates the requirement to evacuate and/or purge the long prior art gas supply line through the point of use, which in turn results in a significantly faster reduction in the concentration of the process gas at the point of use, e.g., the semiconductor processing reactor. The significantly faster reduction in the process gas concentration significantly reduces or even eliminates the prior art transition layer. Thus, the gas flow controller system of this invention permits formation of abrupt transitions between layers.

In addition, the gas flow controller includes a novel configuration that permits stabilizing a second process gas flow simultaneously with supplying a first process gas flow to the semiconductor processing reactor. This reduces the process cycle time which in turn permits processing of more substrate batches in a given time period compared to the prior art processes.

The gas flow controller of this invention also provides for mixing predefined flows of a plurality of gases to create a substantially uniform concentration process gas flow. The substantially uniform concentration process gas flow is controlled so that a predefined portion is directed to the semiconductor processing reactor and a remainder is exhausted. Since the process gas flow from the mixing remains constant, a dopant concentration in the gas flow is precisely controlled. The precise control of the dopant concentration results in the formation of a doped layer on a substrate having a precise predefined concentration across the thickness of the layer in any particular batch and from batch to batch.

In one embodiment of the present invention, a gas flow control system for a semiconductor processing unit includes a first mass flow controller located at a first location and a support structure located at the semiconductor processing unit. The system further includes a gas manifold located at the support structure and a first gas manifold inlet valve located at the support structure and coupled between the gas manifold and the first mass flow controller. The gas manifold and the first gas manifold inlet valve are located at a second location separate and removed from the first location. The gas manifold is coupled through a process gas supply line to one or more injector ports of a reactor in which substrates, e.g., silicon wafers, are processed.

Of importance, the reactor is supported by the support structure, e.g., a table. Since the gas manifold and the gas manifold inlet valve are also located at the support structure as close as physically possible to the reactor, the length of the gas manifold and the process gas supply line is relatively short, e.g., is two feet or less, compared to the corresponding prior art gas supply line between the gas manifold and the one or more injector ports which was relatively long, e.g., ten feet or more. Since the relatively short length of the gas manifold and the process gas supply line holds a small amount of process gas, the process gas within the gas manifold and the process gas supply line is removed in a relatively short time, e.g., thirty seconds or less, after the flow of the process gas to the gas manifold is shut off. Advantageously, the relatively short time in accordance with the present invention allows realization of an abrupt transition between layers formed on a substrate.

Also in accordance with the present invention, a method of controlling gas flow to a reactor includes opening a first gas manifold inlet valve coupled between a first mass flow controller, e.g., a first regulator, and a gas manifold and regulating a mass flow rate of a flow of a first process gas through the first gas manifold inlet valve to the gas manifold with the first mass flow controller. The method further includes opening a gas manifold exhaust valve coupled between a second mass flow controller, e.g., a second regulator, and an exhaust and regulating a mass flow rate of a flow of a second process gas through the gas manifold exhaust valve to the exhaust with the second mass flow controller.

Of importance, the second process gas flows through the second mass flow controller thus stabilizing the mass flow rate of the flow of the second process gas through the second mass flow controller while the first process gas is flowing to the gas manifold and thus to the reactor coupled to the gas manifold.

This is in contrast to the prior art where all the process gases were sent to exhaust through a single common gas manifold and valve thus precluding the possibility of stabilizing a mass flow rate of a flow of process gas through any of the mass flow controllers while another process gas was being supplied to the reactor. Advantageously, stabilizing the mass flow rate of the flow of the second process gas through the second mass flow controller while the first process gas is being supplied to the reactor in accordance with the present invention improves cycle time and thus reduces the cost of processing substrates compared to the prior art.

Also in accordance with the present invention, a system for diluting a dopant gas with a carrier gas includes a mixer, a dopant gas source, e.g., a first gas source, coupled to an inlet port of the mixer and a carrier gas source, e.g., a second gas source, coupled to the inlet port of the mixer. The system further includes a first mass flow controller, e.g., a first regulator, coupled between the inlet port of the mixer and the dopant gas source and a second mass flow controller, e.g., a second regulator, coupled between the inlet port of the mixer and the carrier gas source. Coupled to an outlet port of the mixer are a third mass flow controller, e.g., a third regulator, and a check valve.

During use, the dopant gas is diluted with the carrier gas to result in a process gas having a desired dopant concentration. Since the mass flow rates of the flows of the dopant gas and the carrier gas to the mixer are controlled and regulated by the first and second mass flow controllers, respectively, and are constant, the dopant concentration of the process gas is likewise constant. Thus, regardless of what percentage of the flow of process gas is directed to exhaust through the check valve versus directed to the reactor through the third mass flow controller, the dopant concentration of the process gas is precisely determined and remains constant. This, in turn, results in the formation of a doped layer on a substrate having a precise and constant dopant concentration across the entire thickness of the doped layer in any particular batch as well as from batch to batch. For this reason, a system in accordance with the present invention is well suited to meet and exceed the stringent requirements of existing and emerging process technologies.

Also in accordance with the present invention, a method of diluting a dopant gas with a carrier gas includes setting a mass flow rate of a flow of the dopant gas to a mixer and setting a mass flow rate of a flow of the carrier gas to the mixer, where the dopant gas and the carrier gas mix in the mixer to form a process gas which flows out of the mixer. The method further includes setting a mass flow rate of a flow of the process gas to a reactor, where a difference between the flow of the process gas out of the mixer and the flow of the process gas to the reactor is excess process gas which is directed to exhaust.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

Figure 5A:
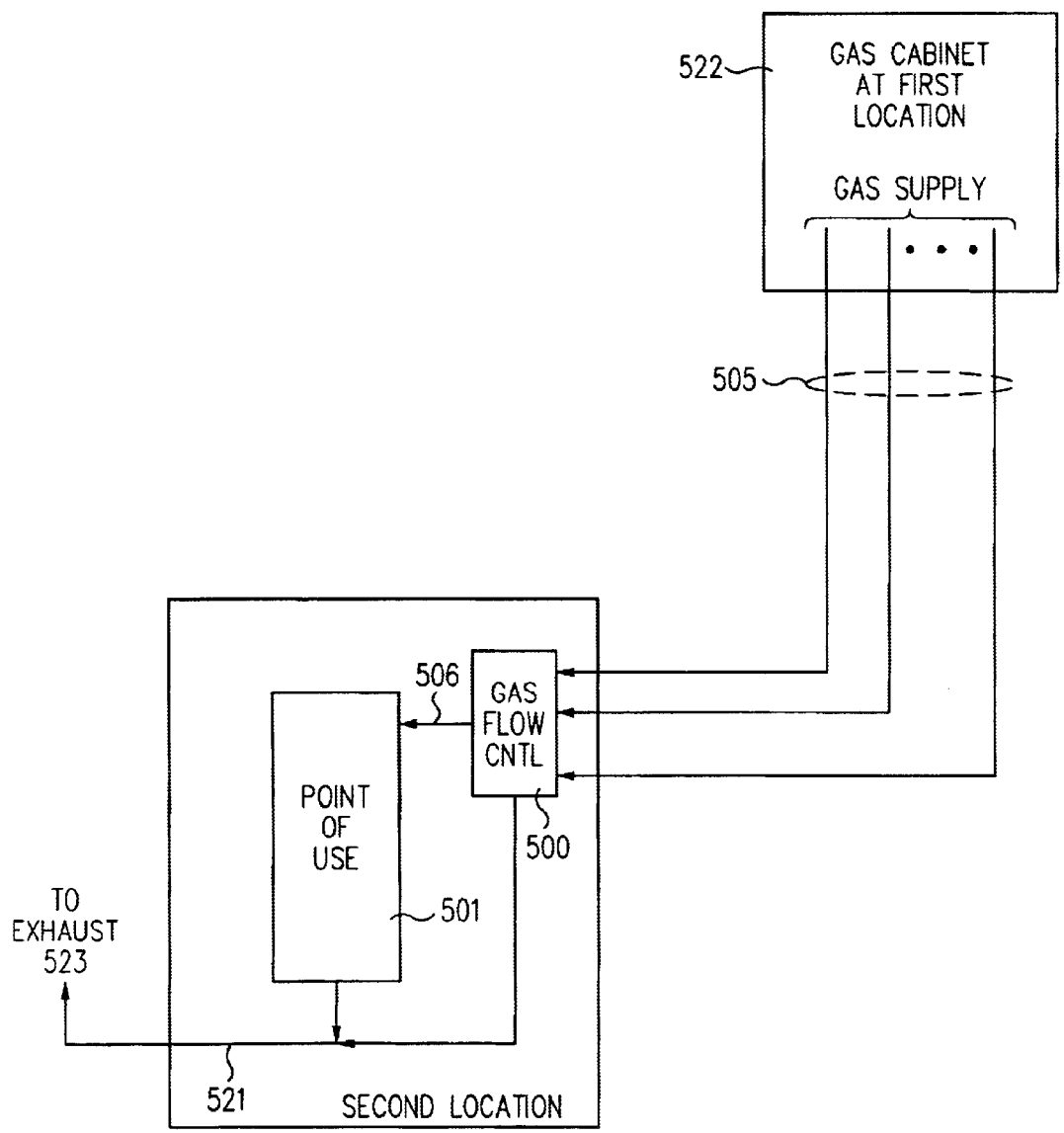
FIG. 5A is a schematic representation of a gas flow control system at a point of use in accordance with the present invention.

According to the principles of this invention, a novel gas flow controller system 500 (FIG. 5A) located directly adjacent to a point of use 501 eliminates the problems associated with the prior art gas flow controller located in a gas cabinet that was remote from the point of use. A plurality of gas lines 505 connect a plurality of process gas sources in gas cabinet 522 to gas flow controller system 500. Gas flow controller system 500 selectively connects and disconnects each gas line in the plurality of gas lines 505 to a short process gas supply line 506 that is connected to point of use 501. Point of use 501 is an apparatus that utilizes the process gas supplied by process gas supply line 506.

For example, a process gas may be supplied to point of use 501 by gas flow controller system 500 to grow a layer on a semiconductor substrate. Short process gas supply line 506 significantly reduces or even eliminates the prior art problem of creating a transition layer after gas flow controller system 500 disconnects the process gas line or lines in the plurality of process gas lines 505 providing the process gas.

Specifically, since gas flow controller system 500 is located directly adjacent to point of use 501, the long prior art process gas supply line (see process gas line 24 of FIG. 1) between the prior art gas manifold and the point of use is eliminated. Consequently, the configuration of FIG. 5A eliminates the requirement to evacuate and/or purge the long prior art gas supply line through the point of use, which in turn results in a significantly faster reduction in the concentration of the gas in the point of use. The significantly faster reduction of the gas concentration significantly reduces or even eliminates the prior art transition layer.

Thus, gas flow controller system 500 of this invention permits formation of abrupt transitions between layers on a substrate using prior art processing equipment without modification to the processing reactor itself or installation of new substrate processing equipment. However, in one embodiment, to enhance formation of abrupt transitions between layers on a substrate, gas flow controller system 500 of this invention is used in combination with a gas dispersion head of Moore et al., related, co-filed and commonly assigned U.S. patent application Ser. No. 09/399,115, entitled "GAS DISPERSION HEAD AND METHOD", which is herein incorporated by reference in its entirety. Since this invention eliminates the need to obtain new processing reactors, the cost of production of substrates with state of the art feature sizes is reduced.

Gas flow controller system 500 also selectively connects and disconnects each gas line in at least a set of gas lines in the plurality of gas lines 505 to an exhaust line 521. More specifically, gas flow controller system 500 simultaneously connects at least one gas line in the set to short process gas supply line 506 to supply a first process gas to point of use 501, and connects another gas line in the set to exhaust line 521 to develop a stabilized mass flow rate of a flow of a second process gas.

In a processing cycle, it is necessary to change from the first process gas to the second process gas. In the prior art systems, the total processing cycle time was affected by the time required for stabilizing the mass flow rate of the flow of the second process gas after the switch in process gases was made. Since the mass flow rate of the flow of the second process gas is fully stabilized by venting the second process gas to the exhaust while the first process gas is being supplied to point of use SO, when the switch is made to the second process gas, there is effectively no lost time waiting for the mass flow rate of the flow of the second process gas to stabilize. Consequently, gas flow controller system 500 and the method of use of gas flow controller system 500 improves the processing cycle time compared to the prior art systems and thus reduces the cost of processing.

Another feature of this invention, that is described more completely below, provides a doped process gas with a stable dopant concentration. In this embodiment, controlled flows of a dopant gas and a carrier gas are mixed to form the doped process gas. Since the flows of the two gases mixed together are controlled, the concentration of the dopant in the doped process gas is a constant. This eliminates the prior art problem of varying concentrations of the dopant in the doped process gas. Thus, not only does this invention reduce of eliminate transitions layers, but also this invention creates a more constant doping distribution within a layer in any particular batch and from batch to batch. Both of these features are essential to meet and/or exceed the stringent requirements of existing and emerging process technologies.

Figure 5B:
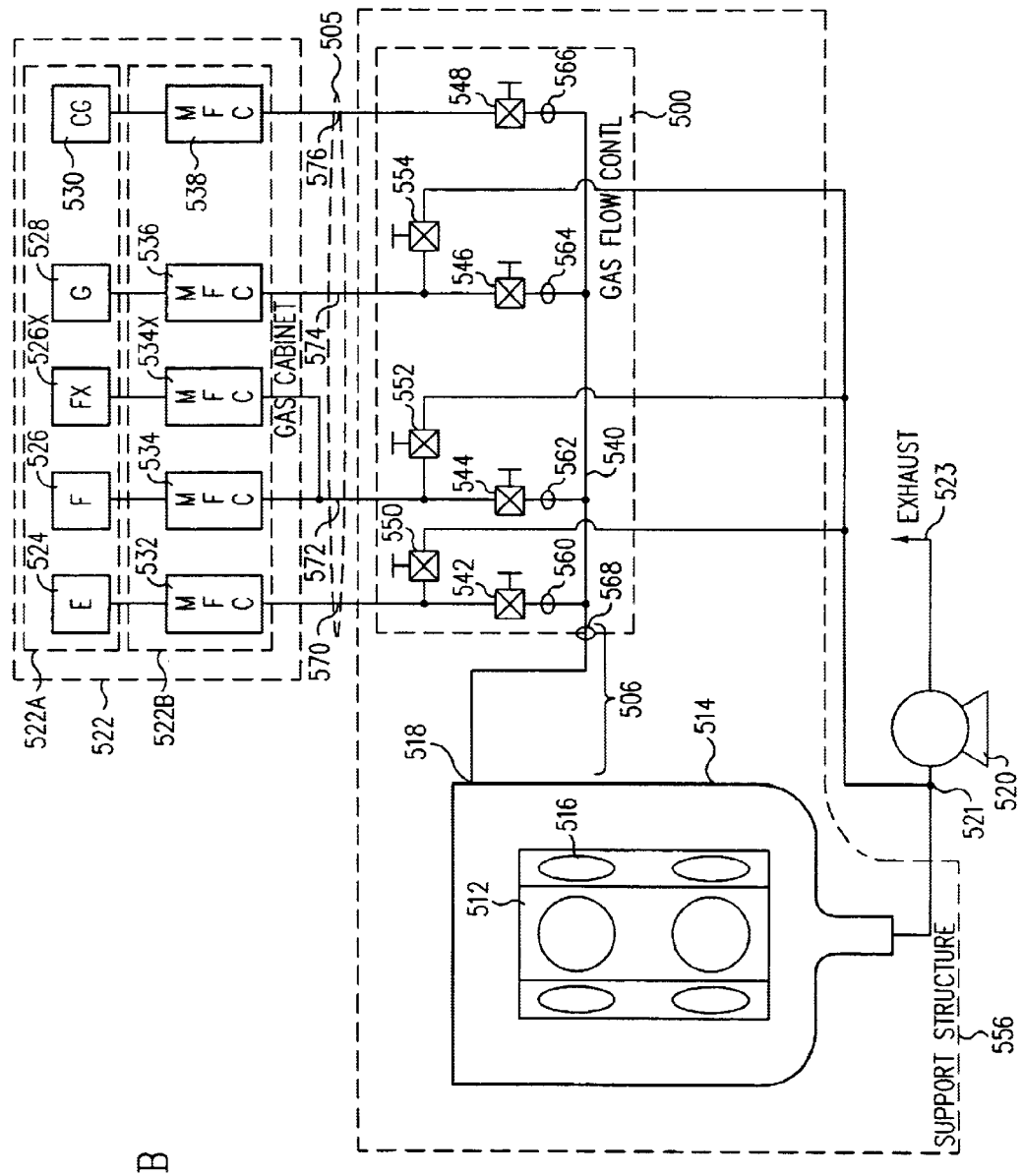
FIG. 5B is a schematic representation of a semiconductor processing reactor at a point of use that includes a gas flow control system in accordance with the present invention.

More particularly, FIG. 5B is a schematic representation of a semiconductor processing reactor 514 at point of use 501 that includes a gas flow controller system 500 in accordance with the present invention. As shown in FIG. 5B, reactor 514 includes a susceptor 512 supporting a plurality of substrates 516, e.g., silicon wafers. Process gas is supplied to reactor 514 through one or more injector ports 518 of reactor 514. The spent process gas is exhausted from reactor 514 to exhaust 523, through a vacuum pump 520. Alternatively, vacuum pump 520 is not used and the spent process gas is exhausted from reactor 514 directly to exhaust 523.

Located within a gas bottle cabinet 522A are a plurality of process gas sources 524, 526, 528 and a carrier gas source 530. Illustratively, each of the plurality of process gas sources 524, 526, 528 and carrier gas source 530 includes a cylinder of compressed gas and/or a container of liquid or other source of gas. It is important to keep the plurality of process gas sources 524, 526, 528 and carrier gas source 530 in gas bottle cabinet 522A for several reasons as is well known to those of skill in the art. For example, one of these reasons is to protect process gas sources 524, 526, 528 and carrier gas source 530 from getting bumped and damaged. Another reason is to capture any process gases which escape from process gas sources 524, 526, 528 or carrier gas source 530.

In this embodiment, process gas sources 524, 526 and 528 supply process gases E, F and G, respectively. Examples of process gases include N type dopant gas, P type dopant gas, silane ($SiH_4$), silicon tetrachloride ($SiCl_4$), silicon trichloride ($SiCl_3$), dichlorosilane ($SiH_2Cl_2$), hydrogen chloride (HCl), and /or mixtures of these gases. Carrier gas source 530 supplies a carrier gas CG, e.g., hydrogen.

In this embodiment, the mass flow rate of the flow of each of process gases E, F, G to a gas line within the plurality of gas lines 505 is controlled and regulated by a different mass flow controller (MFC) located within a gas cabinet 522B. Gas bottle cabinet 522A and gas cabinet 522B collectively form gas cabinet 522. Gas cabinet 522, e.g., a first location, is separate and removed from reactor 514 and separate and removed from gas flow controller system 500, e.g., a second location.

Specifically, each of MFCs 532, 534, 536 and 538 is coupled to a different process gas source, i.e., gas sources 524, 526, 528 and carrier gas source 530, respectively. Each of MFCs 532, 534, 536 and 538 is also coupled to a different gas line in the plurality of gas lines 505 from gas cabinet 522, i.e., gas lines 570, 572, 574, 576, respectively.

Gas flow control system 500 includes gas manifold 540 located as close as physically possible to injector ports 518, a plurality of gas manifold inlet valves 542, 544, 546 and 548 and a plurality of gas manifold exhaust valves 550, 552 and 554. Each of gas manifold inlet valves 542, 544, 546 and 548 is coupled to a different input port of a plurality of gas manifold input ports, i.e., gas manifold input ports 560, 562, 564, 566, respectively, of gas manifold 540. An output port 568 of gas manifold 540 is coupled to injector ports 518 and thus reactor 514 by process gas supply line 506.

As indicated above, gas flow controller system 500 is located as close as physically possible to injector ports 518 of semiconductor processing reactor 514 so as to minimize the length of process gas supply line 506. If possible, output port 568 of gas manifold 540 is connected directly to injector ports 518. The important aspect is to minimize the volume of gas in the piping, i.e., gas manifold 540 and process gas supply line 506, between gas manifold inlet valves 542, 544, 546, 548 and injector ports 518. Thus, when one or more of gas manifold inlet valves 542, 544, 546, 548 are closed, the time required to purge or evacuate gas manifold 540 and process gas supply line 506 is minimized because the volume of gas has been minimized. Consequently, there is not enough of the process gas available to from a transition layer of any consequence.

In this embodiment, gas flow controller system 500 is mounted on a support structure 556 for reactor 514 as close as physically possible to reactor 514. This configuration is suitable for reducing the thickness of any transition layer formed to the point that the transition layer is not significant in the operation of devices formed using the substrate. This is in sharp contrast to the prior art systems described above which produced unacceptable transition layers.

During use, one of process gases E, F, G or carrier gas CG or a combination of process gas E, F, G and/or carrier gas CG is supplied to gas manifold 540 and thus to injector ports 518 and reactor 514.

Each gas line 570, 572, 574 in the plurality of gas lines 505 is coupled to exhaust 523 through one of gas manifold exhaust valves 550, 552 and 554, respectively, and, more particularly, is coupled to an inlet port of vacuum pump 520 if vacuum pump 520 is used otherwise directly to exhaust 523.

In accordance with the present invention, controlling a process gas flow to reactor 514, e.g., process gas E, includes opening gas manifold inlet valve 542 and regulating a mass flow rate of a flow of process gas E through gas manifold inlet valve 542 to gas manifold 540 with MFC 532, e.g., a first regulator. While process gas E is flowing to reactor 514, gas manifold exhaust valve 554 that is coupled between mass flow controller (MFC) 536, e.g., a second regulator, and exhaust 523 is opened and a mass flow rate of a flow of a process gas G through gas manifold exhaust valve 554 to exhaust 523 is regulated with MFC 536.

Of importance, process gas G flows through MFC 536 and the mass flow rate of the flow of process gas G through MFC 536 is stabilized while process gas E is flowing through gas manifold 540 to reactor 514.

In another embodiment, to stabilize mass flow rates of flows of process gases E, F, G through MFCS 532, 534, 536, respectively, gas manifold exhaust valves 550, 552 and 554 are opened and MFCS 532, 534 and 536 are activated to induce a flow of process gas E, F and G, respectively. After a period of time, e.g., a few seconds, the mass flow rates of the flows of process gases E, F, G through MFCS 532, 534 and 536 stabilize and MFCS 532, 534 and 536 accurately control and regulate the mass flow rates of flows of process gases E, F and G, respectively.

Once the flows through MFCs 532, 534 and 536 are stabilized, gas manifold inlet valves 542, 544 and 546 are opened and gas manifold exhaust valves 550, 552 and 554 are closed. Thus, the flows of process gases E, F, and G are redirected into reactor 514. To stop the flows of process gases E, F and G, gas manifold inlet valves 542, 544 and 546 are closed and MFCs 532, 534 and 536 are deactivated.

In one embodiment, reactor 514 is held and supported by support structure 556, e.g., a table. Support structure 556 is separate from, and located at a distance from, gas cabinet 522. Alternatively, gas cabinet 522B of gas cabinet 522 is located at and attached to support structure 556 and gas bottle cabinet 522A of gas cabinet 522 is separate from, and located at a distance from, support structure 556.

Gas manifold 540 and process gas supply line 506 are located at, and in one embodiment attached to, support structure 556.

Of importance, gas manifold inlet valves 542, 544, 546, 548 and gas manifold exhaust valves 550, 552, 554 are also located at, and in one embodiment attached to, support structure 556. Thus, the length of process gas supply line 506 and gas manifold 540 is relatively short, e.g., is two feet or less.

Due to the relatively short length of the piping from the plurality of gas manifold inlet valves 542, 544, 546, 548 to injector ports 518, upon closing of one or any combinations of gas manifold inlet valves 542, 544 and 546, process gas within gas manifold 540 and process gas supply line 506 is removed in a relatively short time, e.g., thirty seconds or less.

This is in contrast to the prior art where gas manifold 38 (FIG. 1) and valve 40 are located in gas cabinet 22 at a substantial distance from reactor 14 and thus require a substantial time, e.g., thirty seconds to two minutes or more, to remove process gas from the relatively long length of line 24, e.g., ten feet or more, which extends from reactor 14 to gas cabinet 22. Returning to FIG. 5B, the relatively short length of gas manifold 540 and process gas supply line 506 allows realization of an abrupt transition between layers formed on substrates 516 as discussed further below.

In embodiments in the above description, process gases E, F and G are simultaneously supplied to exhaust 523 or to reactor 514. However, in light of this disclosure, it is understood that a single process gas E, F, or G, or any combination of process gases E, F, or G, can be supplied, regulated, and directed as described. Further, additional process gas sources, mass flow controllers and valves can be supplied if additional process gases are needed depending upon the particular process performed in reactor 514.

Further, although only a single process gas source 524, 526 or 528 and a single MFC 532, 534 or 536 is coupled to a set of gas manifold inlet valves 542, 544 or 546 and gas manifold exhaust valves 550, 552 or 554, respectively, in light of this disclosure it is understood that additional process gas sources and mass flow controllers can be coupled. For example, an additional process gas source 526X and mass flow controller 534X are coupled in parallel with process gas source 526 and MFC 534 to the set of gas manifold inlet valve 544 and gas manifold exhaust valve 552.

Figure 6:
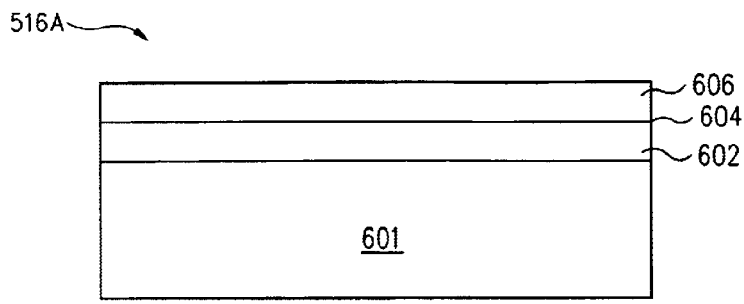
FIG. 6 is a cross-sectional view of a substrate after processing in accordance with the present invention.

FIG. 6 is a cross-sectional view of a substrate 516A after processing in accordance with the present invention. As shown in FIG. 6, substrate 516A includes a body 601, e.g., monocrystalline silicon. Substrate 516A further includes a first layer 602 on body 601, a second layer 606 and a transition layer 604 between layers 602, 606. For example, first layer 602 is a heavily doped P type silicon layer (hereinafter HD layer 602) and second layer 606 is a lightly doped P type silicon layer (hereinafter LD layer 606).

To form substrate 516A, referring to FIGS. 5B and 6 together, substrates 516 including substrate 516A are placed inside of reactor 514 and on susceptor 512. Reactor 514 is purged and in one embodiment a flow of carrier gas CG from carrier gas source 530 to reactor 514 is established. Substrates 516 are heated in a conventional manner. Gas manifold exhaust valves 550, 552 are then opened and MFCS 532, 534 are activated to initiate flows and regulate mass flow rates of flows of process gases E, F from process gas sources 524, 526, respectively to exhaust 523.

For example, process gas E is a P type dopant gas in a carrier gas, and process gas F is a source of silicon e.g., is trichlorosilane. After the mass flow rates of the flows of process gases E, F through MFCS 532, 534 have stabilized, gas manifold inlet valves 542, 544 are opened and gas manifold exhaust valves 550, 552 are closed. Thus, MFCs 532, 534 regulate the mass flow rates of flows of process gases E, F from process gas sources 524, 526 through MFCS 532, 534 and gas manifold inlet valves 542, 544, respectively, to gas manifold 540. Process gases E, F mix in gas manifold 540, the resultant gas mixture is hereinafter referred to as process gas E, F. Process gas E, F then flows through gas manifold 540, process gas supply line 506, injector ports 518 and into reactor 514. Process gas E, F contacts heated substrates 516 thus forming HD layer 602 on body 601.

While HD layer 602 is being formed, gas manifold exhaust valve 554 is opened and MFC 536 is activated to initiate a flow and regulate a mass flow rate of the flow of process gas G from process gas source 528 through MFC 536, gas manifold exhaust valve 554 and to exhaust 523. Advantageously, the mass flow rate of the flow of process gas G through MFC 536 is stabilized while process gas E, F is being supplied to reactor 514.

This is in contrast to the prior art where all process gases A, B, C (FIG. 1) were sent to exhaust 23 through a single common gas manifold 3B and valve 42 thus precluding the possibility of stabilizing a mass flow rate of the flow of a process gas through any of MFCs 32, 34, 36 while another process gas was being supplied to reactor 14. Returning to FIG. 5B, stabilizing a mass flow rate of a flow of process gas G through MFC 536 while another process gas E, F is being supplied to reactor 514 in accordance with the present invention improves cycle time and thus reduces the cost of processing substrates 516 compared to the prior art.

Figure 7:
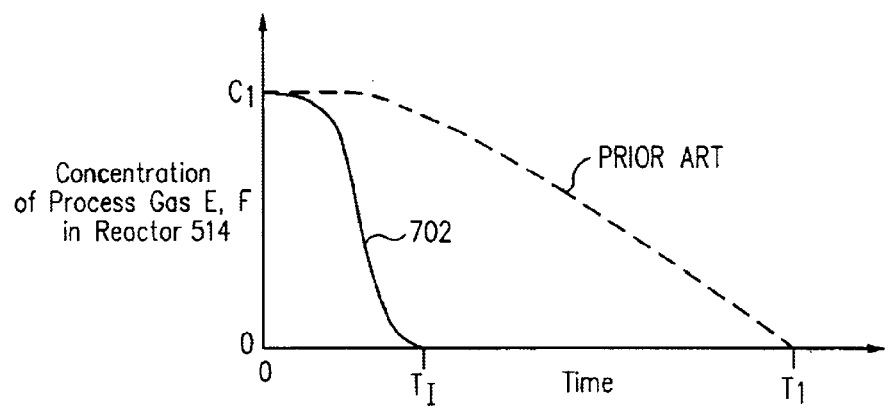
FIG. 7 is a graph of process gas concentration in a reactor verses time after shutting off the flow of the process gas to the reactor in accordance with the present invention.

FIG. 7 is a graph of the concentration of process gas E, F inside of reactor 514 versus time after closing of gas manifold inlet valves 542, 544 in accordance with the present invention. Referring to FIGS. 5B and 7 together, at time T=0, gas manifold inlet valves 542, 544 are closed and MFCs 532, 534 are deactivated to stop the flows of process gas E, F to gas manifold 540 and reactor 514. Since gas manifold inlet valves 542, 544 are located at support structure 556 as close as physically possible to reactor 514, the volume of process gas E, F between injector ports 518 and gas manifold inlet valves 542, 544 is relatively small. Thus, as indicated by curve 702 of FIG. 7, upon closing of gas manifold inlet valves 542, 544, the concentration of process gas E, F in reactor 514 rapidly decreases.

At a time T=TI, e.g., thirty seconds or less, essentially all of process gas E, F has been removed from reactor 514. In this embodiment, carrier gas CG is supplied from carrier gas source 530 through MFC 538 and gas manifold valve 548 to gas manifold 540 to flush process gas E, F from gas manifold 540, process gas supply line 506 and reactor 514. Of importance, the time (TI) to remove process gas E, F from reactor 514 in accordance with the present invention is substantially less than the time (T1) to remove process gas from a reactor in accordance with the prior art. Rapid removal of process gas E, F from reactor 514 is critical to obtaining an abrupt transition between layers as discussed below.

Since the mass flow rate of the flow of process gas G through MFC 536 is stabilized while process gas E, F is supplied to reactor 514 as described above, upon closing of gas manifold inlet valves 542, 544, gas manifold inlet valve 546 is immediately opened and gas manifold exhaust valve 554 is closed. Thus, the flow of process gas G is redirected from exhaust 523 to reactor 514 and, more particularly, is redirected through gas manifold inlet valve 546, gas manifold 540, process gas supply line 506, injection ports 518 and into reactor 514. Process gas G reacts with heated substrates 516 thus forming LD layer 606 above HD layer 602 (and on transition layer 604 to the extent it is formed). After LD layer 606 is formed, gas manifold inlet valve 546 is closed, MFC 536 is deactivated. After cooling, stopping the flow of carrier gas CG and purging reactor 514, substrates 516 are removed from reactor 514.

Figure 8:
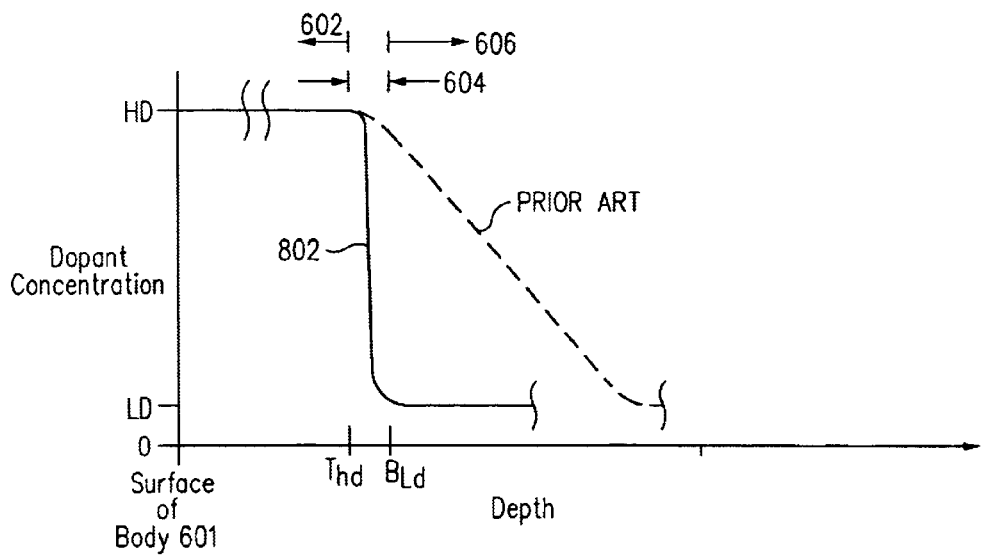
FIG. 8 is a graph of dopant concentration versus depth in the substrate of FIG. 6 in accordance with the present invention.

FIG. 8 is a graph of dopant concentration versus is depth in substrate 516A of FIG. 6 in accordance with the present invention. As shown by a trace 802 in FIG. 8, HD layer 602 is a heavily doped P type silicon layer having a constant dopant concentration HD. The top of HD layer 602 is located at a distance Thd from the surface of body 601 which corresponds to the desired thickness of HD layer 602.

Referring to FIGS. 5B and 8 together, after the desired thickness of HD layer 602 is formed (i.e., at distance Thd), gas manifold inlet valves 542, 544 are closed to stop the flow of process gas E, F to reactor 514. Advantageously, as described above, upon closing of gas manifold inlet valves 542, 544, the flow of process gas E, F to reactor 514 is essentially instantaneously stopped. Thus, the dopant concentration abruptly falls off from the top of HD layer 602 to the bottom of LD layer 606, i.e., across the width of transition layer 604 from distance Thd to distance Bld. In one embodiment, the transition between HD layer 602 and LD layer 606 is such that HD layer 602 and LD layer 606 are continuous with one another and transition layer 604 is not formed.

Figure 3:
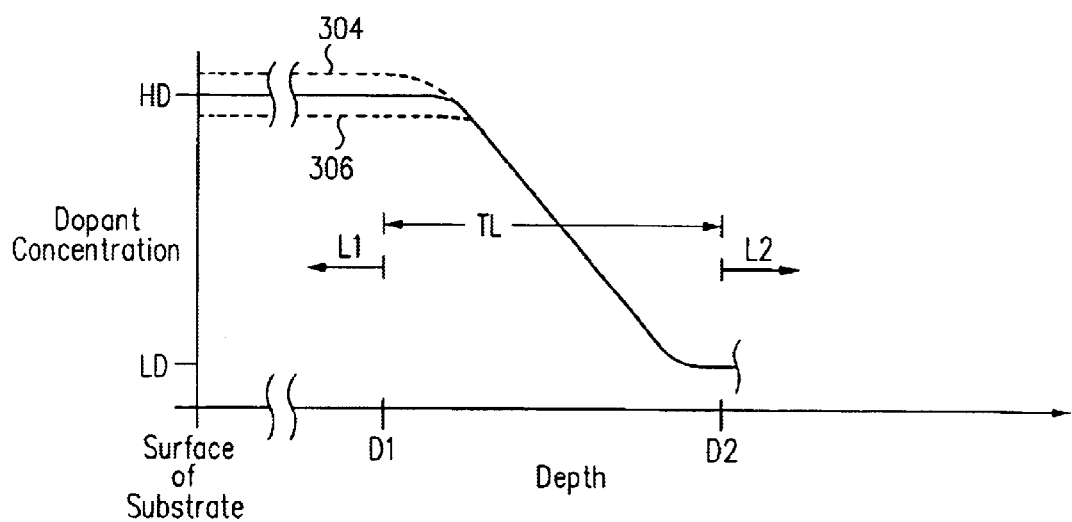
FIG. 3 is a graph of dopant concentration versus depth in a substrate in accordance with the prior art.

Accordingly, system 500 is well suited to meet the requirements of existing and emerging process technologies which demand abrupt transition between layers. This is in contrast to the prior art (see FIG. 3) where the dopant concentration of transition layer TL between layers L1, L2 gradually changes from heavily doped HD at the bottom of transition layer TL to lightly doped LD at the top of transition layer TL.

Referring again to FIG. 6, substrate 516A includes both first layer 602 and second layer 606. As described above, in one embodiment, first layer 602 is a heavily doped P type silicon layer and second layer 606 is a lightly doped P type silicon layer. However, in an alternative embodiment, one or both of layers are N type or are undoped. In a further alternative, first layer 602 is lightly doped and second layer 606 is heavily doped. In another embodiment, only layer 602 is formed. In light of this disclosure, those of skill in the art will recognize that a variety of process gases can be manipulated to form a variety of substrates such as those described above and numerous other variations.

Further, in one embodiment, gas flow controller system 500 is used during substrate cleaning, etching and/or other substrate treatment. Advantageously, use of system 500 allows an abrupt termination of the substrate cleaning, etching and/or other substrate treatment for reasons similar to those discussed above.

System 500 in accordance with the present invention also improves the ability to control thickness of a deposited layer compared to the prior art. In particular, by essentially instantaneously stopping the flow of process gas to reactor 514 (FIG. 5B), the growth of the layer being formed is also essentially instantaneously stopped resulting in a precise thickness of the layer. This is in contrast to the prior art (see FIG. 3) where transition layer TL had a substantial thickness equal to distance D2 at the top of transition layer TL minus distance D1 at the bottom of transition layer TL.

Referring again to FIG. 5B, in one embodiment, carrier gas CG is supplies to reactor 514 from carrier gas source 530 during the entire processing of substrates 516. Since carrier gas CG continuously flows through gas manifold 540 and process gas supply line 506, gas manifold 540 and process gas supply line 506 are continually flushed with carrier gas CG. This avoids cross-contamination from residual process gas remaining in gas manifold 540 and process gas supply line 506.

Figure 1:
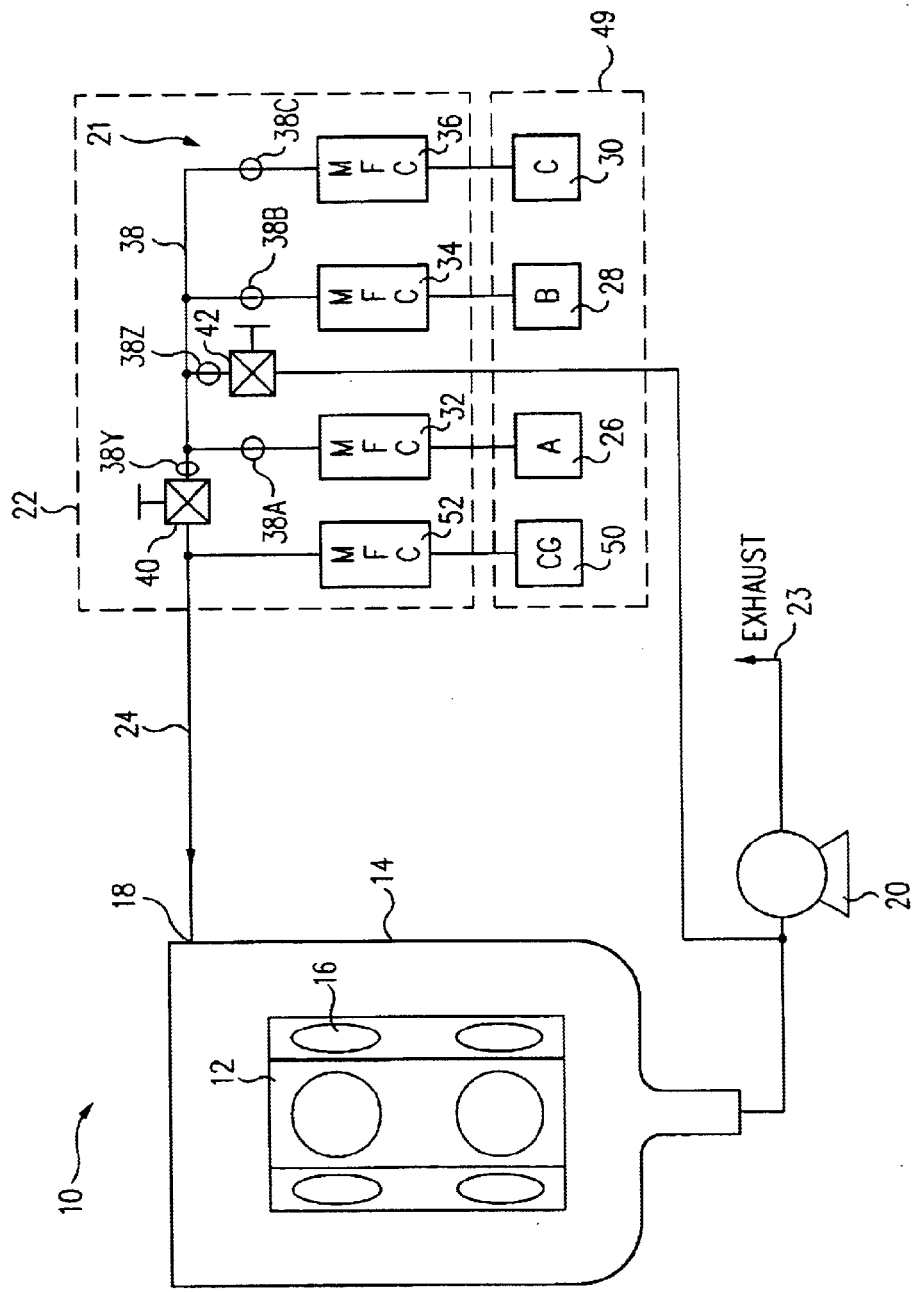
FIG. 1 is a schematic representation of a semiconductor processing system in accordance with the prior art.
Figure 2:
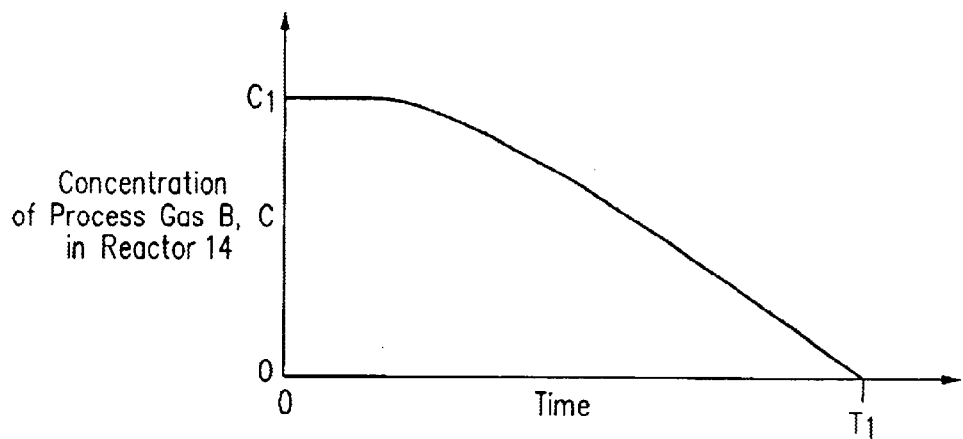
FIG. 2 is a graph of process gas concentration in a reactor verses time after shutting off the flow of the process gas to the reactor in accordance with the prior art.

In contrast, referring to FIG. 1, carrier gas source 50 was coupled to process gas supply line 24 and not to gas manifold 38. Thus, carrier gas CG from carrier gas source 50 did not flush gas manifold 38. Disadvantageously, residual process gas remaining in gas manifold 38 could cause significant cross-contamination of the process gas provided to reactor 14 depending upon the particular application.

Figure 9:
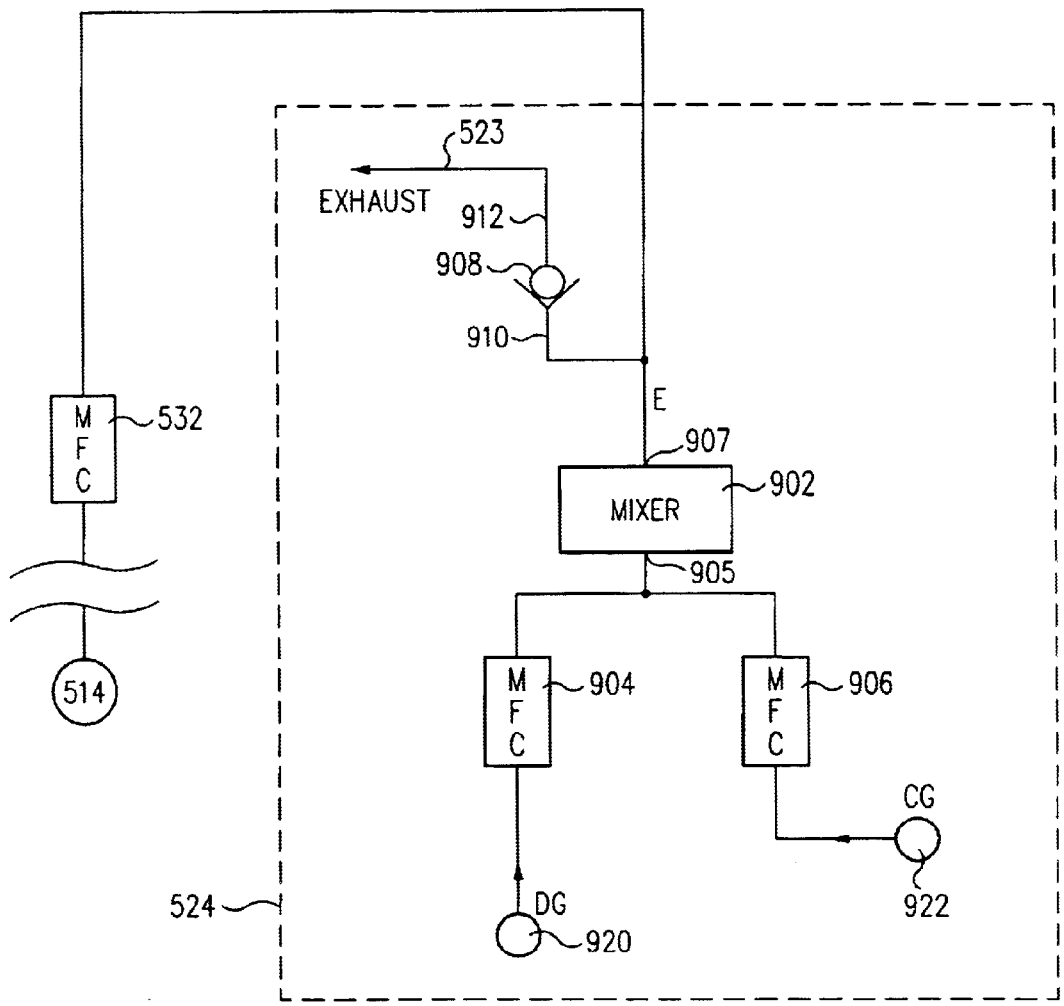
FIG. 9 is a schematic representation of a process gas source of FIG. 5B illustrating the dilution of a dopant gas with a carrier gas in accordance with one embodiment of the present invention.

FIG. 9 is a schematic representation of process gas source 524 of FIG. 5B illustrating the dilution of a dopant gas DG, e.g., a first gas, with a carrier gas CG, e.g., a second gas, in accordance with one embodiment of the present invention. As shown in FIG. 9, process gas source 524 includes a mixer 902. Coupled to an inlet port 905 of mixer 902 through mass flow controllers (MFCs) 904, 906 are dopant gas source 920, e.g., a first gas source, and a carrier gas source 922, e.g., a second gas source, respectively.

MFCs 904, 906 regulate and control the mass flow rates of flows of a dopant gas DG from dopant gas source 920 and a carrier gas CG from carrier gas source 922, respectively, to mixer 902. For example, dopant gas source 920 is a compressed gas cylinder of arsine in hydrogen, diborane in hydrogen or phosphine in hydrogen and carrier gas source 922 is a compressed gas cylinder of hydrogen. As further examples, MFC 904 is a 30 standard cubic centimeters per minute (SCCM) mass flow controller and MFC 906 is a 30 standard liters per minute (SLM) mass flow controller.

In mixer 902, carrier gas CG and dopant gas DG mix. The mixture of carrier gas CG and dopant gas DG flows out of an outlet port 907 of mixer 902 as process gas E. Coupled to outlet port 907 of mixer 902 are a check valve 908 and MFC 532. MFC 532 controls and regulates the mass flow rate of the flow of process gas E to reactor 514 as discussed above. Check valve 908 is coupled to exhaust 523 and allows process gas E to flow in one direction only from mixer 902 past check valve 908 and to exhaust 523 when the pressure drop from an inlet port 910 to an outlet port 912 of check valve 908 exceeds a predetermined amount, e.g., 22 to 30 PSIG. Thus, in the event that the flow of process gas E out of mixer 902 exceeds the flow of process gas E through MFC 532, the excess process gas E, i.e., the difference between the flows of process gas E out of mixer 902 and the flow through MFC 532, is sent to exhaust 523 past check valve 908. The mass flow rate of the flow of excess process gas E through check valve 908 equals the difference between the mass flow rate of the flow of process gas E out of mixer 902 and the mass flow rate of the flow of process gas E through MFC 532 to reactor 514.

During use, dopant gas DG is diluted with carrier gas CG to result in a process gas E having a desire dopant concentration, i.e., a desired percentage of dopant gas DG. More particularly, the mass flow rates of the flows of dopant gas DG and carrier gas CG are set using MFCs 904, 906, respectively, to result in a process gas E having a desired dopant concentration. For example, to obtain a process gas E containing 0.1% of dopant gas DG and 99.9% of carrier gas CG, MFC 904 is set to 10 SCCM and MFC 906 is set to 9.99 SLM. Although mixing of two gases in mixer 902 is described, i.e., dopant gas DG and carrier gas CG, in light of this disclosure it is understood that more than two gases can be mixed in mixer 902 simply by coupling additional gas sources and mass flow controllers to inlet port 905 of mixer 902.

Since the mass flow rates of the flows of dopant gas DG and carrier gas CG to mixer 902 are controlled and regulated by MFCs 904, 906, respectively, and are constant, the dopant concentration of process gas E is likewise constant. Thus, regardless of what percentage of the flow of process gas E out of mixer 902 is directed to exhaust 523 through check valve 908 versus directed to reactor 514 through MFC 532, the dopant concentration of process gas E is precisely determined and remains constant.

Referring to FIGS. 6 and 8 together, this, in turn, results in HD layer 602 having a precise and constant dopant concentration HD across the entire thickness of HD layer 602 in a batch and also from batch to batch. For this reason, system 500 in accordance with the invention is well suited to meet and exceed the stringent requirements of existing and emerging process technologies.

Figure 4:
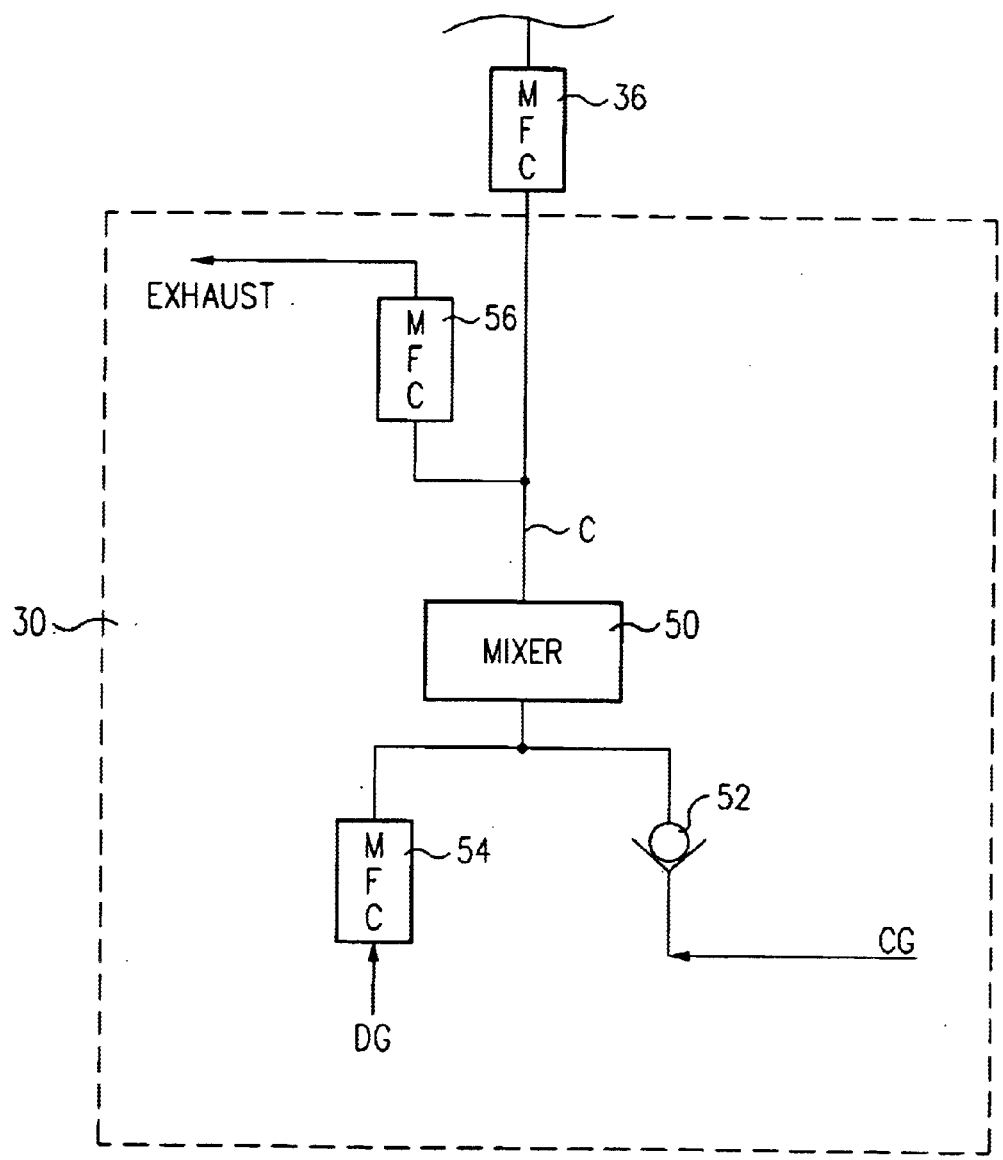
FIG. 4 is a schematic representation of a process gas source of FIG. 1 illustrating the dilution of a dopant gas with a carrier gas in accordance with the prior art.

In contrast, the process gas source 30 of FIG. 4 in accordance with the prior art provides a process gas C having an unpredictable dopant concentration. In particular, the inventor has discovered that use of MFCs 36, 56 coupled in parallel to the outlet port of mixer 50 as illustrated in FIG. 4 inherently resulted in variations in the mass flow rate of the flow of process gas C out of mixer 50 over time. Since the mass flow rate of the flow of dopant gas DG to mixer 50 was held constant by MFC 54, the mass flow rate of the flow of carrier gas CG into mixer 50 necessarily varied as the mass flow rate of the flow of process gas C out of mixer 50 varied. Since the mass flow rate of the flow of carrier gas CG relative to the mass flow rate of the flow of dopant gas DG into mixer 50 varied, the resulting dopant concentration of process gas C varied. Thus, the dopant concentration of layer L1 in FIG. 3 varied as indicated by the traces 304, 306 which is unacceptable for some applications.

Figure 10A:
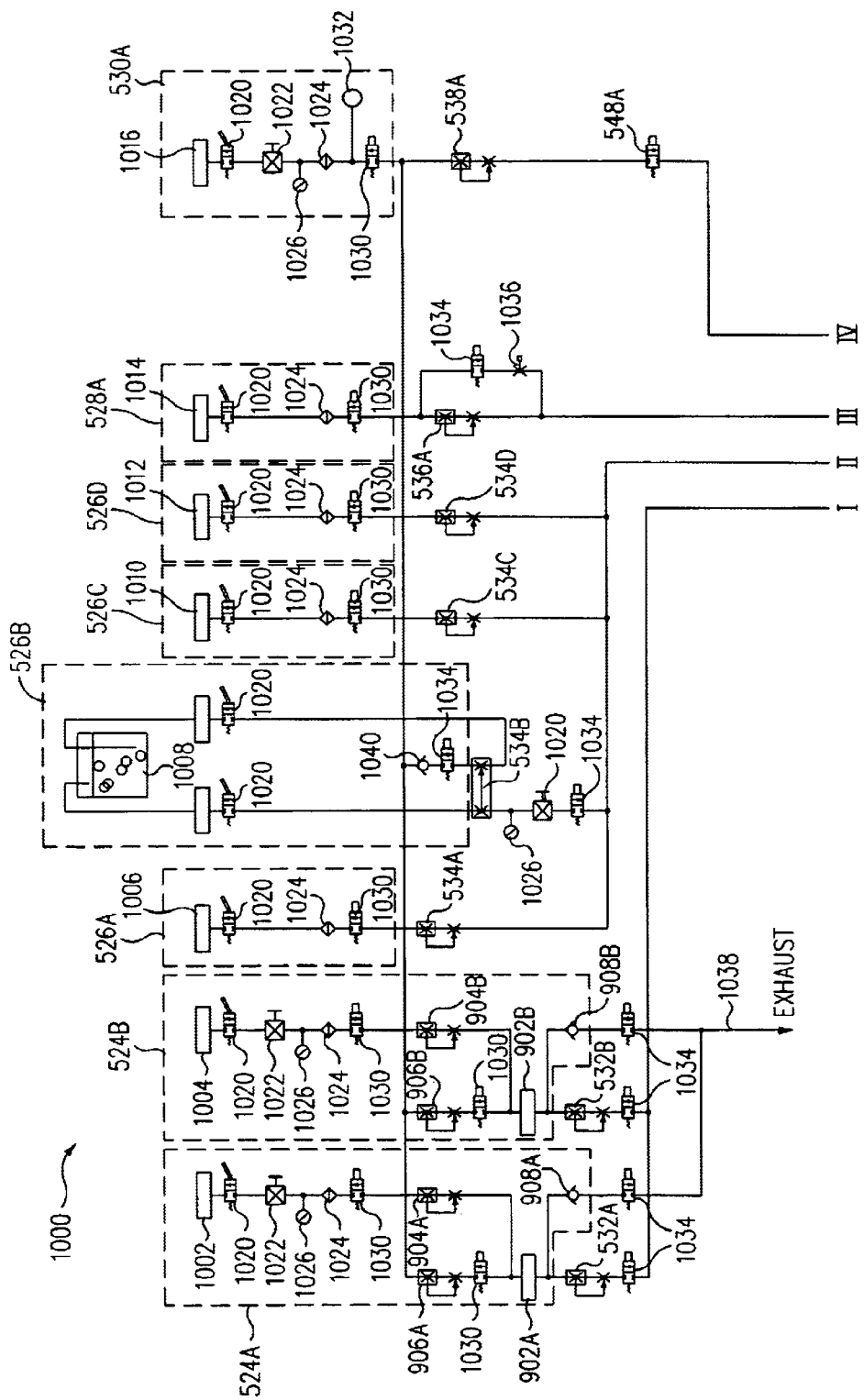
FIG. 10, which consists of FIGS. 10A, 10B, is a schematic representation of a semiconductor processing system which includes a gas flow control system in accordance with one embodiment of the present invention.

FIG. 10 which consists of FIGS. 10A, 10B, is a schematic representation of a semiconductor processing system 1000 including a gas flow control system in accordance with one embodiment of the present invention. Illustrative specifications for the various characteristics shown in FIG. 10 are set forth below in Table 1.

TABLE 1

| CHARACTERISTIC | SPECIFICATION |
| --- | --- |
| 512A | Susceptor |
| 514A | Reactor |
| 516B | Substrates |
| 518A, 518B | Injector port |
| 522A | Gas cabinet |
| 524A, 524B, 526A, 526B, 526C, 526D, 528A | Process gas source |
| 530A | Carrier gas source |
| 532A, 532B, 904A, 904B | Mass flow controller (300 SCCM H2) |
| 534A, 534D | Mass flow controller (3000 SCCM N2) |
| 534B | Mass Flow Controller |
| 534C | Mass flow controller (50 SLM H2) |
| 536A | Mass flow controller (10 SLM N2) |
| 538A | Mass flow controller (200 SLM H2) |
| 540A | Gas (injection) manifold |
| 542A, 544A, 546A | Nupro or pneumatic valve |
| 548A, 550A, 552A, 554A | Nupro valve |
| 1034 | |
| 556A | Below table top |
| 556B | above table top |
| 902A, 902B | Mixer |
| 906A, 906B | Mass flow controller (30 SLM H2) |

TABLE 1-continued

| CHARACTERISTIC | SPECIFICATION |
|---|---|
| 908A, 908B, 1040 | Check valve |
| 1002 | N type dopant |
| 1004 | P type dopant |
| 1006 | SiH4/Aux |
| 1008 | Single Source controller |
| 1010 | SiCl4/SiCl3 |
| 1012 | SiH2Cl2 |
| 1014 | HCl |
| 1016 | H2 |
| 1018 | N2 Purge |
| 1020 | Manual on-off valve |
| 1022 | Regulator |
| 1024 | Filter |
| 1026 | Pressure Gauge 0-30 PSIG |
| 1030 | Nupro or pneumatic valve |
| 1032 | Pressure Switch |
| 1036 | Metering Valve |
| 1038 | Exhaust |
| 1044 | Hepa filter cabinet |
| 1046 | Exhaust cabinet |

The drawings and the forgoing description gave examples of the present invention. The scope of the present invention, however, is by no means limited by these specific examples. Numerous variations, whether explicitly given in the specification or not, such as differences in structure, dimension, and use of material, are possible. For example, although mass flow controllers are set forth as the regulators for controlling and regulating the mass flow rates of the flows of various gases, it is understood that other regulators such as needle valves, fixed diameter orifices or source controllers can be used. Further, it is understood that the various items described are coupled to one another using conventional techniques and that the items are coupled to one another directly without any other items interposed between the coupled items or, alternatively, that other items, e.g., pressure gauges, valves and other conventional gas system items, can be interposed between the coupled items. The scope of the invention is at least as broad as given by the following claims.

I claim:

1. A system comprising:
   a mixer;
   a first gas source coupled to an inlet port of said mixer;
   a second gas source coupled to said inlet port of said mixer;
   a first regulator coupled between said inlet port of said mixer and said first gas source;
   a second regulator coupled between said inlet port of said mixer and said second gas source;
   a third regulator coupled to an outlet port of said mixer; and
   a check valve coupled to said outlet port of said mixer and to an exhaust.

2. The system of claim 1 wherein said first gas source is a dopant gas source and wherein said second gas source is a carrier gas source.

3. The system of claim 1 wherein said first regulator regulates a flow rate of a flow of a first gas from said first gas source and wherein said second regulator regulates a flow rate of a flow of a second gas from said second gas source.

4. The system of claim 3 wherein said first regulator and said second regulator are mass flow controllers.

5. A system comprising:
   a mixer;
   a first gas source coupled to an inlet port of said mixer;
   a second gas source coupled to said inlet port of said mixer;
   a first regulator coupled between said inlet port of said mixer and said first gas source;
   a second regulator coupled between said inlet port of said mixer and said second gas source;
   a third regulator coupled to an outlet port of said mixer;
   a check valve coupled to said outlet port of said mixer and to an exhaust, wherein a first flow of a process gas exits said mixer, wherein a second flow of said process gas passes through said third regulator, a difference between said first flow and said second flow being a third flow of said process gas which passes through said check valve.

6. A system comprising:
   a mixer;
   a first gas source coupled to an inlet port of said mixer;
   a second gas source coupled to said inlet port of said mixer, wherein a first process gas from said first process gas source and a second process gas from said second process gas source mix in said mixer;
   a first regulator coupled between said inlet port of said mixer and said first gas source;
   a second regulator coupled between said inlet port of said mixer and said second gas source;
   a third regulator coupled to an outlet port of said mixer, said regulator being a mass flow controller; and
   a check valve coupled to said outlet port of said mixer and to an exhaust.

* * * * *